(12) United States Patent
Hsiao

(10) Patent No.: US 7,042,237 B2
(45) Date of Patent: May 9, 2006

(54) SEMICONDUCTOR TEST SYSTEM HAVING A TESTER AND A PROBER AND TEST METHOD THEREOF

(75) Inventor: Li-Sheng Hsiao, Hsinchu County (TW)

(73) Assignee: Winbond Electronics Corporation, Hsinchu (TW)

( * ) Notice: Subject to any disclaimer, the term of this patent is extended or adjusted under 35 U.S.C. 154(b) by 174 days.

(21) Appl. No.: 10/797,069

(22) Filed: Mar. 11, 2004

(65) Prior Publication Data

US 2005/0200374 A1 Sep. 15, 2005

(51) Int. Cl.
*G01R 31/02* (2006.01)
(52) U.S. Cl. .......................................... 324/754; 327/3
(58) Field of Classification Search ............... 327/3
See application file for complete search history.

(56) References Cited

U.S. PATENT DOCUMENTS 6,906,542 B1 * 6/2005 Sakagawa et al. .......... 324/754

6,970,004 B1 * 11/2005 Ishitani et al. ............... 324/752

* cited by examiner

*Primary Examiner*—Vinh Nguyen
*Assistant Examiner*—Trung Q. Nguyen
(74) *Attorney, Agent, or Firm*—Rosenberg, Klein & Lee

(57) ABSTRACT

A semiconductor test system having a tester and a prober and the test method thereof are proposed. A test mark signal and a control board having a discrimination circuit and a protection circuit are added to a test connection interface of the tester. When performing multi-chip test, the connection result is displayed after checking the test mark signal by the discrimination circuit. Whether the test can be performed or not is then determined by the protection circuit. When the interface connection is incorrect due to man-made carelessness, an alarm will buzz for warning, and the protection circuit will be simultaneously activated to disable the tester. Normal test can be performed only if the interface connection is correct. Thereby, the correctness of the test results can be ensured to reduce returned purchase and to enhance the quality of production.

3 Claims, 5 Drawing Sheets

SEMICONDUCTOR TEST SYSTEM HAVING A TESTER AND A PROBER AND TEST METHOD THEREOF

The present invention relates to a semiconductor test system having a tester and a prober and the test method thereof and, more particularly, to a semiconductor test system having a tester and a prober and the test method thereof, which have discrimination and protection functions to prevent users from still performing production test without finding erroneous connection of the test interface due to man-made carelessness.

BACKGROUND OF THE INVENTION

In the current IC fabrication process, semiconductor testing plays an important role. After complicated semiconductor fabrication procedures of a batch of wafers have been finished, they are sent to the testing stage. Meanwhile, it is necessary to perform test of each die to discriminate quality of dies on each wafer. After packaging of normal dies is finished, commercial products in the market are obtained. Through the steps of electric or physical test of semiconductor, dies not up to the specification are immediately discarded, to avoid waste of production cost and time, thereby enhancing production efficiency, greatly increasing the yield of production and ensuring the quality of product.

The test interface of existent testers only uses simple test connection signals. There is no test mark signal and determination and protection circuit. As shown in FIG. 1, because wafers are tested by a semiconductor test system having no discrimination and protection functions, erroneous classification of IC may easily occur. Moreover, when performing multi-chip test, erroneous connection of the interface connection may occur due to man-made carelessness. If test is performed without immediately finding the error, incorrect test results will be obtained without self-awareness. If bad products are shipped to customers, not only will they be returned, but the business credit will also be badly affected.

The conventional test flowchart in FIG. 1 will be described in detail below. First, a finished wafer is prepared to be sent to a semiconductor test machine before test (Step 10). When a prober detects the position of a measurement point, it sends out a start signal (Step 11). A tester then receives the start signal to start the test (Step 12). Next, after the tester has finished the test, it sends out the test result (Bin) signal (Step 13). Subsequently, the tester sends out an end of test (EOT) signal again (Step 14), and the prober receives the Bin signal and the EOT signal (Step 15). Whether the test of the whole wafer is finished is checked (Step 16). If the answer is yes, the test of the next wafer is then performed; otherwise, it is necessary to feedback a signal to Step 11, and Steps 11 to 16 needs to be repeated. The test of the next wafer can be performed only after the test of each die of the whole wafer has been finished. Meanwhile, whether the tested wafer is the last one is checked. That is, whether the test of all the batch of wafers has been finished is checked (Step 17). If the test of the all batch of wafers has been finished, the test ends (Step 18). Otherwise, Steps 11 to 17 are repeated. During the test process, only simple test connection signals like the start signal, the Bin signal and the EOT signal. There is no circuit having discrimination and protection functions. Therefore, erroneous classification of IC may easily arise.

Accordingly, the present invention aims to propose a semiconductor test system having a tester and a prober and having discrimination and protection functions and the test method thereof to resolve the problems in the prior art.

SUMMARY AND OBJECTS OF THE PRESENT INVENTION

The primary object of the present invention is to provide a semiconductor test system having a tester and a prober and the test method thereof to avoid incorrect test results caused by erroneous connection of the test interface due to man-made carelessness.

Another object of the present invention is to provide a semiconductor test system and the test method thereof, wherein a discrimination step is performed before performing wafer test to determine whether the connection of the interface connection is correct. When the connection is incorrect, a start signal will be interrupted to disable the test system, hence accomplishing the effect of prevention.

Yet another object of the present invention is to provide a semiconductor test system and the test method thereof, wherein a lamp will be on to inform users of correct interface connection for normal test when the interface connection is correct.

Still yet another object of the present invention is to provide a semiconductor test system and the test method thereof, wherein an alarm will give out an alarming signal when the interface connection of the test system is incorrect.

To achieve the above objects, the present invention provides a semiconductor test system having a tester and a prober. The test system performs test with discrimination and protection functions to ensure the correctness of test results. A test mark signal and a control board having a discrimination circuit and a protection circuit are added to a test connection interface of the tester. When performing multi-chip test, the connection result is displayed after checking the test mark signal by the discrimination circuit. Whether the test can be performed or not is then determined by the protection circuit. When the interface connection is incorrect, an alarm will buzz for warning, and the protection circuit will be simultaneously activated to disable the tester. Normal test can be performed only if the interface connection is correct. Thereby, the correctness of the test results can be ensured to reduce returned purchase and to enhance the quality of production.

The test method of the present invention comprises the following steps. First, a wafer is sent to the semiconductor test machine. When the prober correctly probes to the position of a measurement point, it sends out a start signal. Meanwhile, the test mark signal and the discrimination circuit are exploited to determine whether the interface connection is correct. If the connection is correct, the start signal gets through, and a tester receives the start signal to start testing. After the test has been finished, the tester sends out a test result (Bin) signal and an end of test (EOT) signal. The prober then receives the Bin signal and the EOT signal. Next, whether the test of the whole wafer has been finished is checked. If the answer is yes, the test of the next wafer is performed; otherwise, the above steps are repeated. The test of the next wafer can be performed only after the test of each die of the whole wafer has been finished. Finally, whether the test of all the batch of wafers has been finished is checked.

The various objects and advantages of the present invention will be more readily understood from the following detailed description when read in conjunction with the appended drawings, in which:

DETAILED DESCRIPTION OF PREFERRED EMBODIMENT

Figure 1:
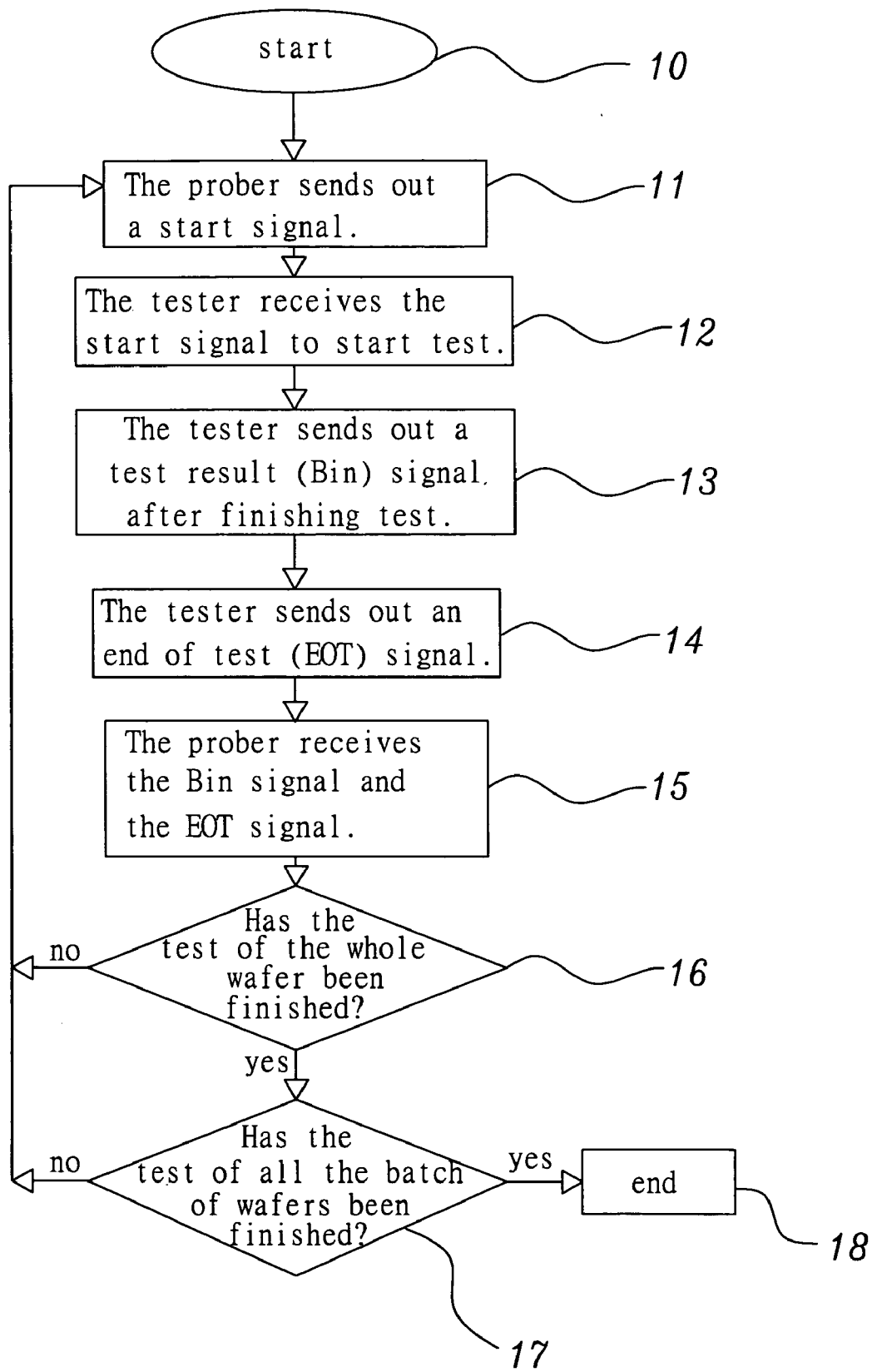
FIG. 1 shows the flowchart of a conventional semiconductor test system.
Figure 2:
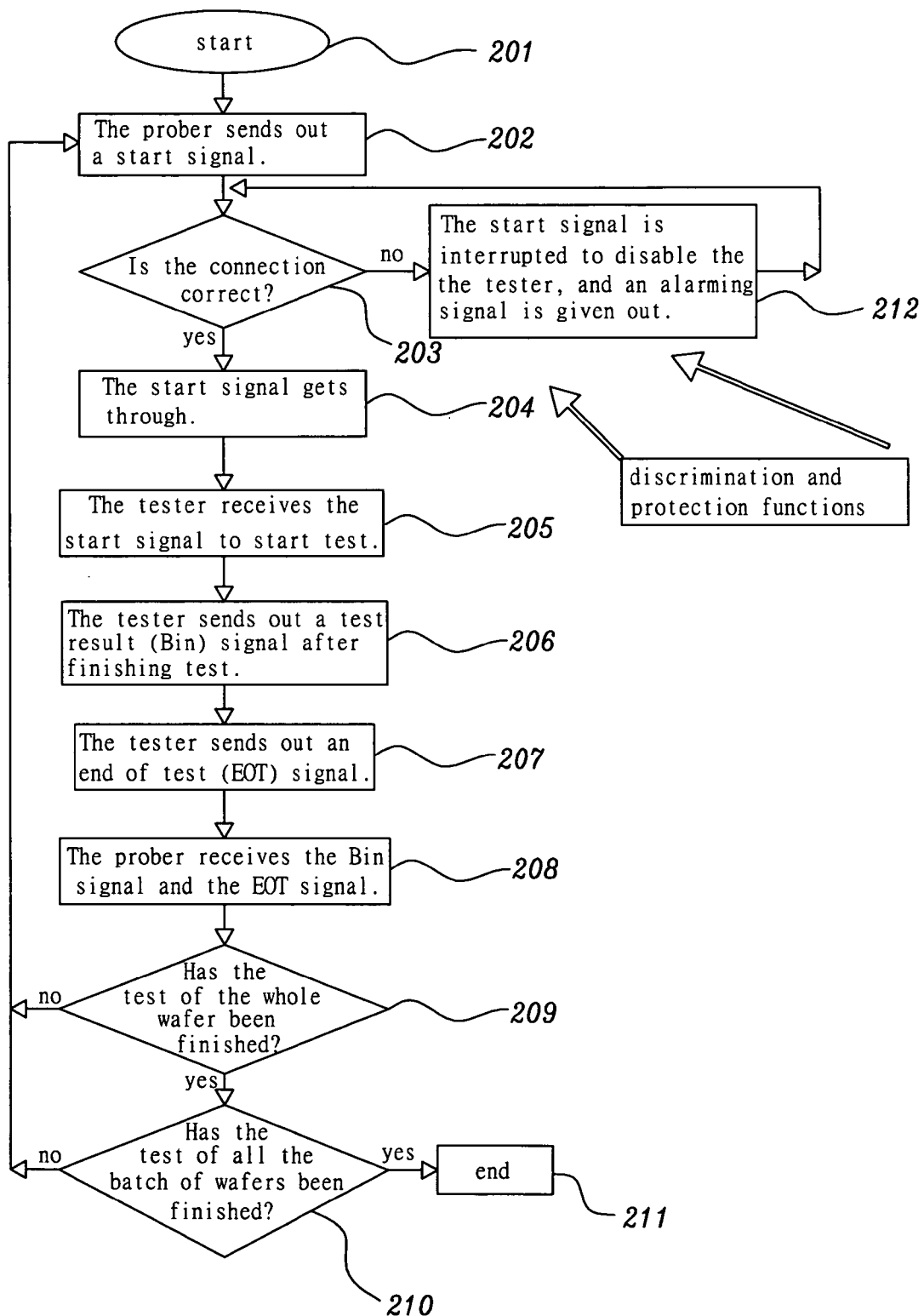
FIG. 2 shows the flowchart of main steps of the present invention.

As shown in FIG. 2, a finished wafer is first prepared to be sent to a semiconductor test machine before test (Step 201). The test machine comprises a prober and a tester. When the prober successfully detects the position of a measurement point, it will immediately send out a start signal (Step 202). Meanwhile, a test mark signal and a control board having a discrimination circuit and a protection circuit are added to a test interface of the tester. The discrimination circuit is utilized to compare the test mark signal to determine whether the connection is correct (Step 203). If the connection is correct, the tester start signal gets through, and a lamp is on (Step 204). Otherwise, the tester start signal is interrupted, and the protection circuit is simultaneously activated to disable the tester (Step 212). An alarming signal is also activated to drive an alarm to buzz so as to warn the test workers. After the test workers solve the problem, Step 203 is performed again. In other words, normal operation is allowed only if the interface connection is correct.

After the connection is determined to be correct in Step 203, the tester receives the start signal to start test of the semiconductor wafer (Step 205). The tester sends out a test result (Bin) signal after finishing test (Step 206). The tester sends out an end of test (EOT) signal (Step 207). The prober then receives the Bin signal and the EOT signal (Step 208). Next, whether the test of each die of the whole wafer has been finished is checked (Step 209). If the answer is yes, the test of the next wafer is performed; otherwise, it is necessary to feedback a signal to Step 202, and Steps 202 to 208 need to be repeated. The test of the next wafer can be performed only after the test of each die of the whole wafer has been finished. Subsequently, whether the test of all the batch of wafers has been finished is checked (Step 210). If the answer is yes, the test job ends (Step 211); otherwise, Steps 202 to 210 will be repeated until the test of all the batch of wafers has been finished.

In the present invention, a discrimination step is performed before wafer test to determine whether the interface connection is correct, hence accomplishing the effect of discrimination. When the interface connection is incorrect, the start signal will be interrupted to disable the test system, hence accomplishing the effect of prevention.

Figure 3:
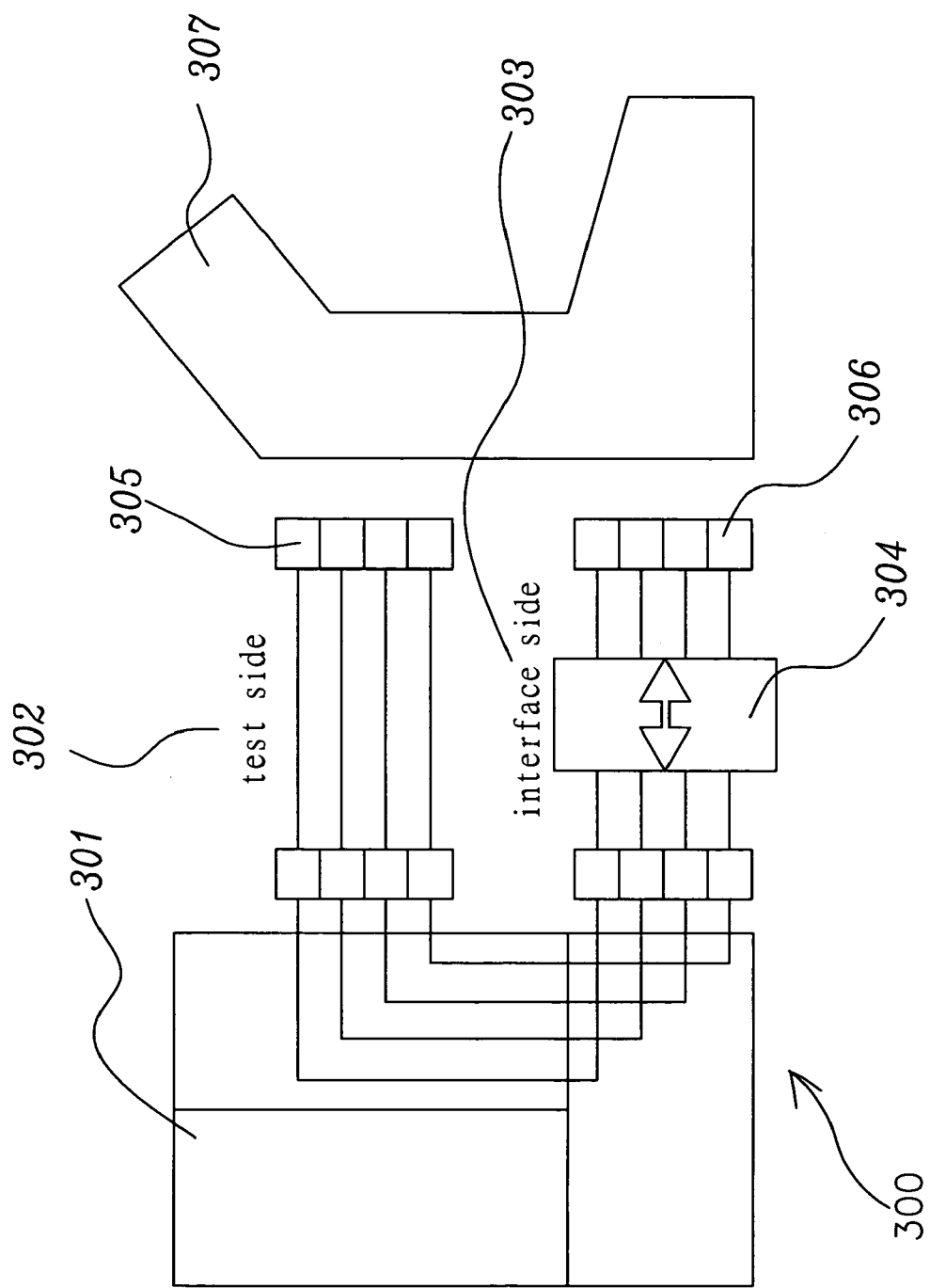
FIG. 3 is a diagram of a test system of the present invention.

As shown in FIG. 3, a test system 300 comprises a tester 301 and a prober 307. The same mark signal is simultaneously added to a node A 305 at a test side 302 and a node B 306 at an interface side 303 of the tester 301. This signal can be a binary code composed of "0" and "1". Meanwhile, whether the connection is correct is determined using the mark signal of the tester 301 and signals of the circuit of a control board 304.

Figure 4:
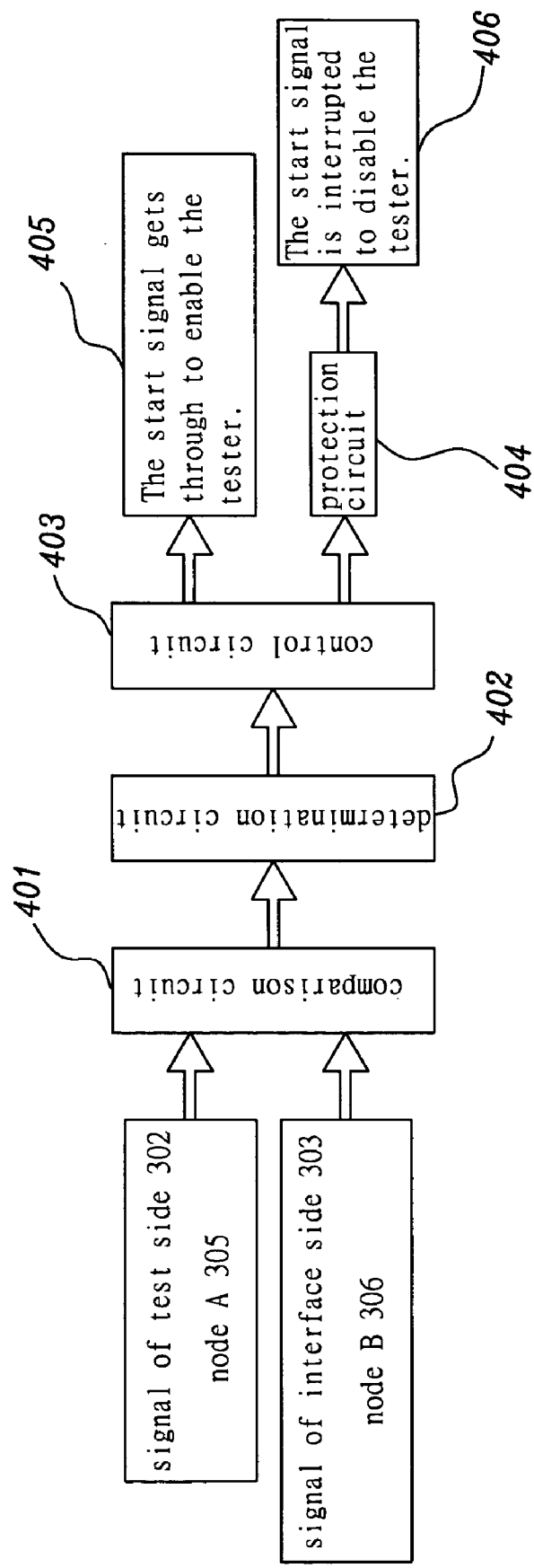
FIG. 4 is a block diagram of the test flowchart of a control board of the present invention.
Figure 5:
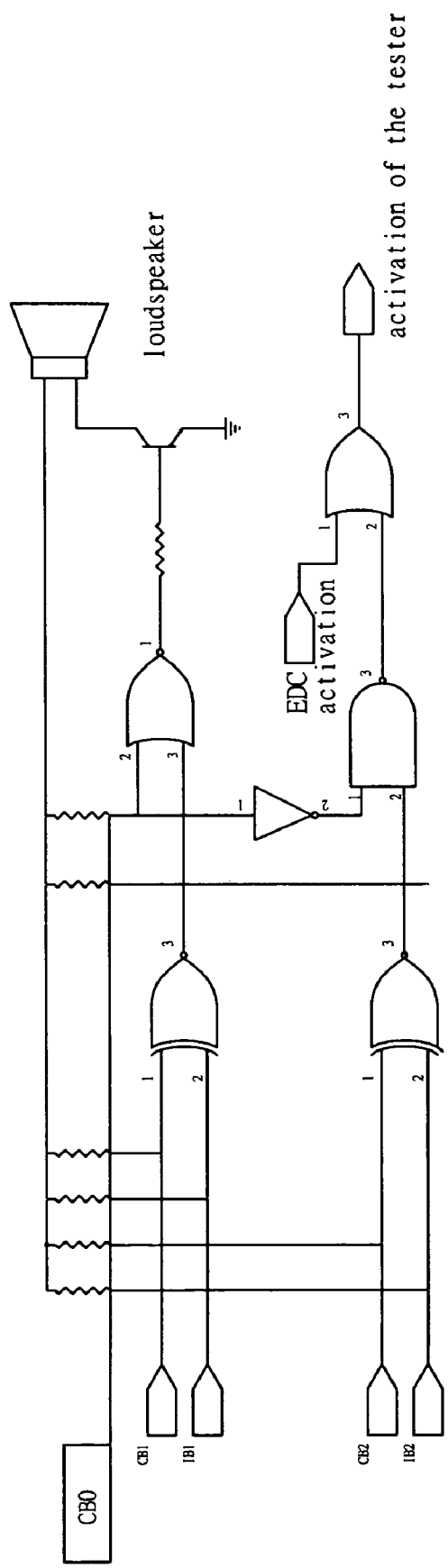
FIG. 5 is a real circuit diagram of a determination circuit of the control board of the present invention.

The control board 304 is added to the interface connection between the test side 302 of the tester 301 and the interface side 303 of the prober 307. This control board 304 comprises a comparison circuit 401, a determination circuit 402 and a control circuit 403. As shown in FIG. 4, the comparison circuit 401 compares the mark signals at the signal node A 305 at the test side 302 and the signal node B 306 at the interface side 303. The comparison result is then sent to four DUTS (2 bits) of the determination circuit 402 shown in FIG. 5. Next, the determination circuit 402 determines whether the interface connection is correct according to the comparison result sent out by the comparison circuit 401, and then sends out a determination result to the control circuit 403. The control circuit 403 bases on the determination result sent out by the determination circuit 402 to control a lamp, an alarm and test start, whose functions are described below.

(1) Lamp: when the connection is correct, a lamp like a light-emitting diode (LED) will be on to inform users of correct connection for normal test.
(2) Alarm: an alarming function is provided to give out an alarming signal when the connection is incorrect.
(3) Test start: a protection function is provided so that the start signal will be interrupted to disable the test system when the connection is incorrect.

Please refer to FIGS. 3 and 4 simultaneously. The prober 307 sends out the tester start signal to the tester 301 after the whole IC test system 300 is setup. Before the tester 301 receives the tester start signal, the comparison circuit 401 will compare the signals at the node A 305 at the test side 302 and the node B 306 at the interface side 303. The comparison result is then sent to the determination circuit 402. Next, the determination circuit 402 determines whether the interface connection is correct according to the comparison result sent out by the comparison circuit 401, and then sends out a determination result to the control circuit 403. The control circuit 403 makes different responses to the determination result sent out by the determination circuit 402. If the interface connection is incorrect, the control circuit 403 will send out an alarming signal to the alarm to warn the operation staffs, and simultaneously activate the protection circuit 404 to interrupt the tester start signal (406), hence disabling the tester 301. Besides, if the connection is correct, the control circuit 403 will get through the start signal to let the tester 301 start wafer test (405). Also, a lamp like an LED will be on to inform the operation staffs.

To sum up, the present invention proposes a semiconductor test system having a tester and a prober and the test method thereof, wherein a discrimination step is performed before wafer test to determine whether the interface connection is correct, hence accomplishing the effect of discrimination. When the interface connection is correct, normal test can be performed. When the interface connection is incorrect, the start signal will be interrupted to disable the test system, hence accomplishing the effect of prevention. Moreover, an alarm will give out an alarming signal to avoid incorrect test results caused by erroneous connection of the test interface due to man-made carelessness.

Although the present invention has been described with reference to the preferred embodiments thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. A semiconductor test system having a tester and a prober comprising a control board disposed on a test interface of said tester, said control board comprising:
   a discrimination circuit comprising a comparison circuit, a determination circuit and a control circuit; and
   a protection circuit;
   whereby said comparison circuit will compare signals at a test side and at an interface side and send a comparison result to said determination circuit before said tester receives a tester start signal sent out by said prober, said determination circuit will determine whether the connection is correct according to the comparison result and then send a determination result to said control circuit, said control circuit will activate said protection circuit to interrupt said tester start signal according to the determination result if the connection is incorrect, hence disabling said test system.

2. The semiconductor test system as claimed in claim 1, wherein said control circuit can further drive a lamp to be on and get through said tester start signal to let said test system start testing when said determination circuit determines the connection is correct.

3. The semiconductor test system as claimed in claim 1, wherein said control circuit can further send out an alarming signal to an alarm to inform operation staffs for check and correction when said determination circuit determines the connection is incorrect.

* * * * *